United States Patent
Kyoto et al.

(10) Patent No.: US 11,389,895 B2
(45) Date of Patent: Jul. 19, 2022

(54) LASER DEVICE AND LASER PROCESSING MACHINE

(71) Applicant: Mitsubishi Electric Corporation, Tokyo (JP)

(72) Inventors: Tomohiro Kyoto, Tokyo (JP); Daisuke Morita, Tokyo (JP); Hiroyuki Takeuchi, Tokyo (JP); Yumi Genda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/422,450

(22) PCT Filed: Mar. 14, 2019

(86) PCT No.: PCT/JP2019/010682
§ 371 (c)(1),
(2) Date: Jul. 13, 2021

(87) PCT Pub. No.: WO2020/183729
PCT Pub. Date: Sep. 17, 2020

(65) Prior Publication Data
US 2022/0080525 A1   Mar. 17, 2022

(51) Int. Cl.
*B23K 26/064* (2014.01)
*B23K 26/04* (2014.01)
(Continued)

(52) U.S. Cl.
CPC ........ *B23K 26/0643* (2013.01); *B23K 26/042* (2015.10); *B23K 26/0665* (2013.01); *H01S 5/02385* (2021.01); *H01S 5/02423* (2013.01)

(58) Field of Classification Search
CPC ............. H01S 5/02385; H01S 5/02386; H01S 5/02375; H01S 5/0236; H01S 5/0237;
(Continued)

(56) References Cited

U.S. PATENT DOCUMENTS 8,982,920 B2 * 3/2015 Watanabe ................. H01S 5/22
372/44.01
2003/0206336 A1   11/2003 Onaka et al.
(Continued)

FOREIGN PATENT DOCUMENTS

JP    60012786 A  *  1/1985  ........... H01S 5/0237
JP    63143890 A  *  6/1988  ........... G02B 6/4292
(Continued)

OTHER PUBLICATIONS

Machine translation of Japan Patent document No. 2006339569A, Jan. 2022 (Year: 2022).*
(Continued)

*Primary Examiner* — Geoffrey S Evans
(74) *Attorney, Agent, or Firm* — Xsensus LLP

(57) ABSTRACT

A laser device includes: a plurality of laser diodes that emit laser beams having different wavelengths; a partial reflection mirror that resonates the plurality of laser beams emitted by the plurality of laser diodes; and a wavelength dispersion element that causes the plurality of laser beams incident from the plurality of laser diodes in different orientations of optical axes of the laser beams to travel to the mirror with the optical axes aligned. Each of the plurality of laser diodes is integrally formed with an adjustment component that is rotatable around an emission end of the laser diode.

17 Claims, 5 Drawing Sheets

(51) Int. Cl.
*H01S 5/023* (2021.01)
*H01S 5/024* (2006.01)
*B23K 26/06* (2014.01)
*B23K 26/042* (2014.01)
*H01S 5/02385* (2021.01)

(58) Field of Classification Search
CPC .... H01S 5/4037; H01S 5/4012; H01S 5/4062; H01S 5/4087; H01S 5/02423; B23K 26/0643; B23K 26/0665; B23K 26/042; B23K 26/043
See application file for complete search history.

(56) References Cited

U.S. PATENT DOCUMENTS

| | | | |
|---|---|---|---|
| 2008/0279239 A1* | 11/2008 | Kan | H01S 5/02423 372/35 |
| 2010/0074285 A1* | 3/2010 | Stephens | H01S 5/024 372/34 |
| 2011/0075689 A1 | 3/2011 | Miyata et al. | |
| 2016/0218483 A1* | 7/2016 | Tayebati | H01S 5/4012 |
| 2016/0344162 A1 | 11/2016 | Konno et al. | |
| 2017/0304942 A1* | 10/2017 | Ogata | B23K 26/00 |
| 2018/0026425 A1 | 1/2018 | Usuda | |
| 2019/0214786 A1* | 7/2019 | Whitmore | H01S 5/4031 |
| 2020/0136344 A1* | 4/2020 | Oomori | H01S 5/0235 |

FOREIGN PATENT DOCUMENTS

| | | | | | |
|---|---|---|---|---|---|
| JP | 09293917 | A | * | 11/1997 | ............ H01S 3/025 |
| JP | 11340581 | A | * | 12/1999 | ......... H01S 5/02423 |
| JP | 2002156562 | A | * | 5/2002 | ......... H01S 5/02251 |
| JP | 2003-324227 | A | | 11/2003 | |
| JP | 2006-339569 | A | | 12/2006 | |
| JP | 2006339569 | A | * | 12/2006 | |
| JP | 2016-78050 | A | | 5/2016 | |
| JP | 2016-124022 | A | | 7/2016 | |
| WO | 2015/115301 | A1 | | 8/2015 | |

OTHER PUBLICATIONS

Machine translation of Japan Patent document No. 60012786-A, Jan. 2022.*
Machine translation of Japan Patent document No. 63143890-A, Jan. 2022.*
Machine translation of Japan Patent document No. 09293917-A, Jan. 2022.*
International Search Report and Written Opinion dated Jun. 4, 2019, received for PCT Application PCT/JP2019/010682, Filed on Mar. 14, 2019, 7 pages including English Translation.
Decision to Grant dated Sep. 24, 2019, received for JP Application 2019-542750, 5 pages including English Translation.
Office Action dated May 2, 2022 in German Patent Application No. 11 2019 006 8416.4, 10 pages.

* cited by examiner

LASER DEVICE AND LASER PROCESSING MACHINE

CROSS-REFERENCE TO RELATED APPLICATION

The present application is based on PCT filing PCT/JP2019/010682, filed Mar. 14, 2019, the entire contents of which are incorporated herein by reference.

FIELD

The present invention relates to a laser device including a plurality of laser diodes and to a laser processing machine.

BACKGROUND

A laser device including a plurality of laser diodes can produce a higher output than in the case where a laser beam is output by a single laser diode, by coupling the laser beams emitted from the different laser diodes. In a laser device called a direct diode laser (DDL), a plurality of laser beams are coupled by an optical element arranged in a resonator. As the optical element, a wavelength dispersion element is used, which couples a plurality of laser beams by aligning the optical axes of the plurality of laser beams traveling in different orientations of the optical axes.

Patent Literature 1 discloses a laser device that couples the laser beams emitted from a plurality of laser light sources using a diffraction grating arranged in a resonator.

CITATION LIST

Patent Literature

Patent Literature 1: Japanese Patent Application Laid-open No. 2016-78050

SUMMARY

Technical Problem

In a laser device, after a laser diode is arranged in the housing of the laser device, the position or orientation of the laser diode may be adjusted in order to adjust the traveling direction of the laser beam. In the case of the laser device according to Patent Literature 1, the position or orientation of each laser diode is adjusted in order to accurately align the optical axes of a plurality of laser beams. In the case of a laser device including a plurality of laser diodes, it may take time and effort to adjust the position or orientation of each laser diode because the laser diodes are densely arranged. Therefore, the laser device according to Patent Literature 1 is problematic in that it may be difficult to adjust the traveling direction of each laser beam that is emitted from a plurality of laser diodes.

The present invention has been made in view of the above, and an object thereof is to obtain a laser device in which the traveling direction of each laser beam that is emitted from a plurality of laser diodes can be easily adjusted.

Solution to Problem

To solve the above problems and achieve the object, a laser device according to the present invention includes: a plurality of laser diodes to emit laser beams having different wavelengths; a mirror to resonate the plurality of laser beams emitted by the plurality of laser diodes; and a wavelength dispersion element to cause the plurality of laser beams incident from the plurality of laser diodes in different orientations of optical axes of the laser beams to travel to the mirror with the optical axes aligned. Each of the plurality of laser diodes is integrally formed with an adjustment component that is rotatable around an emission end of the laser diode.

Advantageous Effects of Invention

The laser device according to the present invention can achieve the effect that the traveling direction of each laser beam that is emitted from a plurality of laser diodes can be easily adjusted.

DESCRIPTION OF EMBODIMENTS

Hereinafter, a laser device and a laser processing machine according to embodiments of the present invention will be described in detail based on the drawings. The present invention is not limited to the embodiments.

First Embodiment

Figure 1:
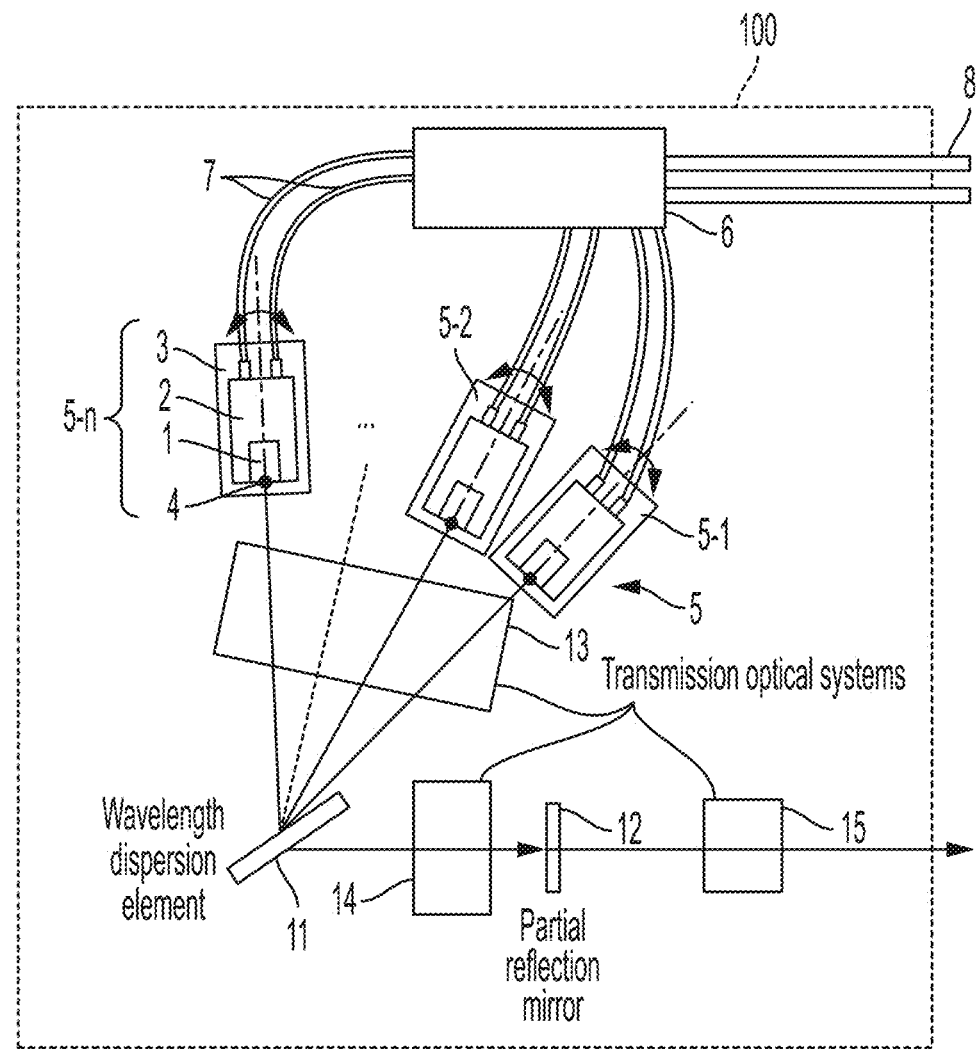
FIG. 1 is a diagram illustrating a configuration of a laser device according to a first embodiment of the present invention.

FIG. 1 is a diagram illustrating a configuration of a laser device according to the first embodiment of the present invention. The laser device 100 according to the first embodiment is a DDL. FIG. 1 depicts components arranged in the housing of the laser device 100. The laser device 100 includes a plurality of laser diodes (LDs) 1 that emit laser beams having different wavelengths, and a partial reflection mirror 12 that is a mirror that resonates a plurality of laser beams emitted by the plurality of LDs 1. Each of the LDs 1 emits a laser beam from an emission end 4. For each of a plurality of laser beams, the partial reflection mirror 12 reflects a part of the incident laser beam and transmits a part of the incident laser beam.

A wavelength dispersion element 11 is a diffraction grating that diffracts each of a plurality of laser beams. The wavelength dispersion element 11 causes a plurality of laser beams incident from the plurality of LDs 1 in different orientations of the optical axes of the laser beams to travel to the partial reflection mirror 12 with the optical axes aligned. The wavelength dispersion element 11 also causes a plurality of laser beams incident from the partial reflection mirror 12 with the optical axes aligned to travel to the plurality of LDs 1 in different orientations of the optical axes. Note that an optical axis is the axis representing the center of the luminous flux of the laser beam. A laser beam travels in the orientation of the optical axis.

The wavelength dispersion element 11 diffracts a plurality of laser beams emitted from the plurality of LDs 1, and separates the laser beams for each order. The wavelength dispersion element 11 is a transmissive diffraction grating. The wavelength dispersion element 11 couples the first-order diffracted rays of the laser beams with each other, and emits the zero-order diffracted rays in a direction different from the direction of the partial reflection mirror 12. Note that the wavelength dispersion element 11 may be a reflective diffraction grating.

The wavelength dispersion element 11 couples a plurality of laser beams with each other by aligning the optical axes of the laser beams which are first-order diffracted rays. The wavelength dispersion element 11 emits the coupled beam toward the partial reflection mirror 12.

The coupled beam reflected by the partial reflection mirror 12 enters the wavelength dispersion element 11 again. The wavelength dispersion element 11 separates the coupled beam into laser beams of different wavelengths. The wavelength dispersion element 11 emits each of the separated laser beams toward one of the plurality of LDs 1. Each of the LDs 1 is equipped with a mirror that reflects the laser beam returned from the wavelength dispersion element 11 to the LD 1. The mirrors in the LDs 1 and the partial reflection mirror 12 form a resonator that resonates a plurality of laser beams. The wavelength dispersion element 11 is arranged in the resonator.

A transmission optical system 13 is an optical system that adjusts the beam diameter and divergence angle of the laser beam that enters the wavelength dispersion element 11 from each of the LDs 1. A transmission optical system 14 is an optical system that adjusts the beam diameter and divergence angle of the laser beam that enters the partial reflection mirror 12 from the wavelength dispersion element 11. A transmission optical system 15 is an optical system that adjusts the beam diameter and divergence angle of the coupled beam that travels to a transmission line such as a process fiber outside the laser device 100. The transmission optical systems 13, 14, and 15 each include an optical element such as a lens, a mirror, or a prism.

Each of the LDs 1 is integrated with a heat sink 2 that cools the LD 1 and an adjustment component 3 that is a component for adjusting the orientation of the LD 1. The adjustment component 3 is a component that is rotatable around the emission end 4 when the orientation of the optical axis of the laser beam that is emitted from the emission end 4 is adjusted. Each of a plurality of LD packages 5-1, 5-2, . . . , and 5-n is a structure in which the LD 1, the heat sink 2, and the adjustment component 3 are integrated. That is, each of the plurality of LDs 1 is integrally formed with the adjustment component 3 that is rotatable around the emission end 4. Here, "n" is an integer of three or more. In the following description, the LD packages 5-1, 5-2, . . . , and 5-n can be collectively referred to as the LD package(s) 5. The number of LD packages 5 included in the laser device 100 may be any number greater than or equal to two.

Cooling water, i.e. a refrigerant for cooling each of the LDs 1, is cooled by a cooling device external to the laser device 100. A manifold 6 in the laser device 100 is equipped with a pipe 8 for inflow of cooling water to the manifold 6 and outflow of cooling water from the manifold 6. The manifold 6 guides the cooling water supplied by the cooling device to the heat sinks 2 of the separate LD packages 5, and joins together the cooling water recovered from the heat sinks 2 of the separate LD packages 5. Note that the cooling device is not illustrated in FIG. 1.

Each of the heat sinks 2 is connected to a pipe 7 for inflow of cooling water to the heat sink 2 and outflow of cooling water from the heat sink 2. The pipe 7 is a flexible resin hose. The cooling water sent out from the manifold 6 passes through the pipe 7 for each heat sink 2 to reach the heat sink 2. After passing through the heat sink 2, the cooling water is returned to the manifold 6 through the pipe 7.

Figure 2:
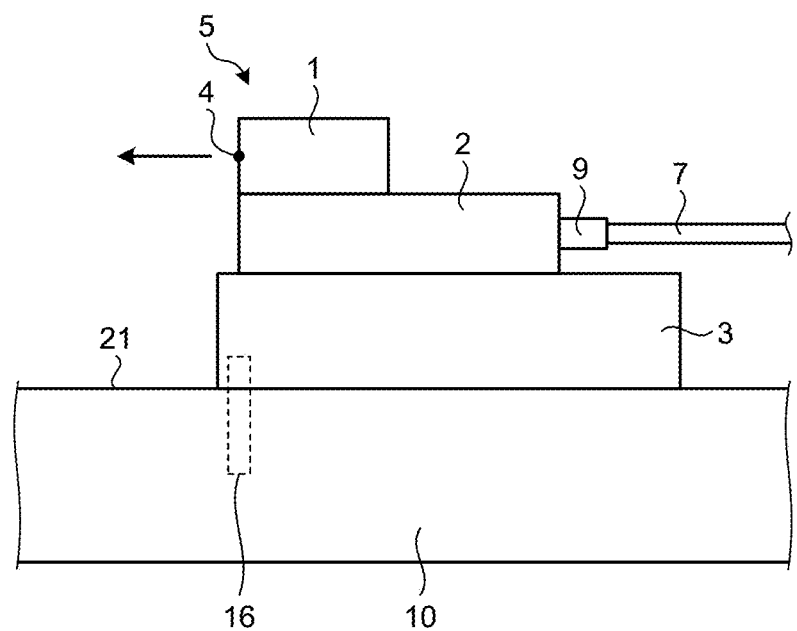
FIG. 2 is a side view illustrating an LD package included in the laser device illustrated in FIG. 1.

FIG. 2 is a side view illustrating an LD package included in the laser device illustrated in FIG. 1. The LD 1 is placed on the heat sink 2. The heat sink 2 is placed on the adjustment component 3. The adjustment component 3 is placed on an installation surface 21. The installation surface 21 is a surface of a base material 10 provided in the housing of the laser device 100. The adjustment component 3 is installed on the base material 10. The pipe 7 is connected to a connection portion 9 formed on the heat sink 2.

An adjustment shaft 16 is a rod-shaped component. The adjustment shaft 16 serves as the center of rotation of the adjustment component 3 when the orientation of the optical axis of the laser beam that is emitted from the emission end 4 is adjusted. The adjustment shaft 16 is located directly below the emission end 4, and is embedded in the adjustment component 3 and the base material 10. The adjustment shaft 16 is a shaft perpendicular to the installation surface 21. The rotation of the adjustment component 3 on the installation surface 21 adjusts the orientation of the optical axis in the plane parallel to the installation surface 21.

When the LD package 5 is installed on the base material 10, as illustrated in FIG. 2, one end part of the adjustment shaft 16 is inserted into the base material 10 and the other end part of the adjustment shaft 16 is inserted into the adjustment component 3. Thus, before being fixed to the base material 10, the LD package 5 reaches a state in which the emission end 4 is positioned as an extension of the adjustment shaft 16 and the LD package 5 is rotatable around the adjustment shaft 16. By rotating the LD package 5 around the adjustment shaft 16 on the base material 10, the orientation of the optical axis of the laser beam that is emitted from the emission end 4 is adjusted in the LD package 5. After the orientation of the optical axis is adjusted, the adjustment component 3 is fixed to the base material 10, and the installation of the LD package 5 is completed.

In this way, by inserting the adjustment shaft 16 into the adjustment component 3, the LD 1 reaches a state in which the emission end 4 is positioned and the orientation of the emission end 4 can be adjusted. Since the emission end 4 can be positioned by inserting the adjustment shaft 16 into the adjustment component 3, the LD 1 can be accurately and easily positioned in the laser device 100. In addition, the rotation of the LD package 5 around the adjustment shaft 16 enables the orientation of the optical axis, that is, the orientation of the LD 1, to be accurately and easily adjusted in the laser device 100.

After the LD package 5 is placed on the base material 10, the orientation of the optical axis is adjusted, which brings the laser device 100 into a state in which the position of the LD 1 and the orientation of the LD 1 have been adjusted. The laser device 100 allows the position of the LD 1 and the orientation of the LD 1 to be adjusted easily, as compared with the case where both the position of the LD 1 and the orientation of the LD 1 need to be adjusted after the LD package 5 is placed on the base material 10. Thus, even when the LD packages 5 are densely arranged in the laser device 100, the position and orientation of each LD 1 can be easily adjusted.

Since the orientation of each LD 1 can be accurately adjusted, the laser device 100 can emit a laser beam of high beam quality. Because the emission end 4 can be positioned with the adjustment shaft 16, the laser device 100 can reduce the amount of change, associated with the adjustment of the orientation of each LD 1, in the traveling direction of the laser beam emitted from the LD 1. For each optical element on which the laser beam emitted from the LD 1 enters, the laser device 100 can reduce the movement of the optical element associated with the adjustment of the orientation of the LD 1. Thus, the laser device 100 can reduce the space for the movement of the optical element associated with the adjustment of each LD 1. In addition, the size of each optical element required for the optical element to receive a laser beam can be reduced. This makes it possible to reduce the size of the laser device 100 and reduce the cost of the laser device 100.

Because a flexible resin hose is used as the pipe 7, the pipe 7 can be freely deformed according to the adjustment of the orientation of the LD 1 in a state the pipe 7 is connected to the connection portion 9. Thus, the laser device 100 allows the orientation of the LD 1 to be adjusted after the connection of the pipe 7 to the manifold 6 and the connection portion 9 is completed. In addition, a resin hose is advantageous in that it is less expensive and smaller in outer diameter than a metal bellows hose, which is another example of a flexible hose.

Here, for the adjustment component 3, the axis perpendicular to the installation surface 21 is defined as the first axis, and the axis parallel to the installation surface 21 and perpendicular to the optical axis is defined as the second axis. In the first embodiment, the laser device 100 includes the adjustment shaft 16, which is the first axis, so that the orientation of the optical axis in the plane parallel to the installation surface 21 can be adjusted. In the laser device 100, the orientation of the optical axis in the plane perpendicular to the installation surface 21 and parallel to the optical axis can be adjusted by rotation around the second axis. In the laser device 100, the LD 1 is rotatable around the emission end 4 even when the orientation of the optical axis is adjusted by rotation around the second axis. Thus, the laser device 100 allows the orientation of the optical axis to be adjusted in the plane perpendicular to the installation surface 21 and parallel to the optical axis.

According to the first embodiment, the laser device 100 allows the orientation of each LD 1 to be easily adjusted because the LD 1 is integrated with the adjustment component 3 that is rotatable around the emission end 4. Thus, the laser device 100 can achieve the effect that the traveling direction of each laser beam that is emitted from the plurality of LDs 1 can be easily adjusted.

Second Embodiment

Figure 3:
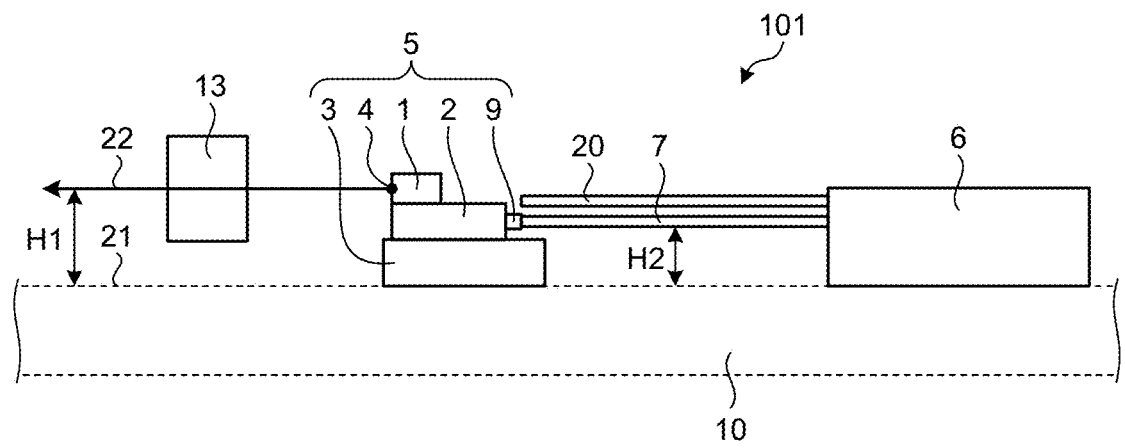
FIG. 3 is a diagram illustrating the main part of a laser device according to a second embodiment of the present invention.
Figure 4:
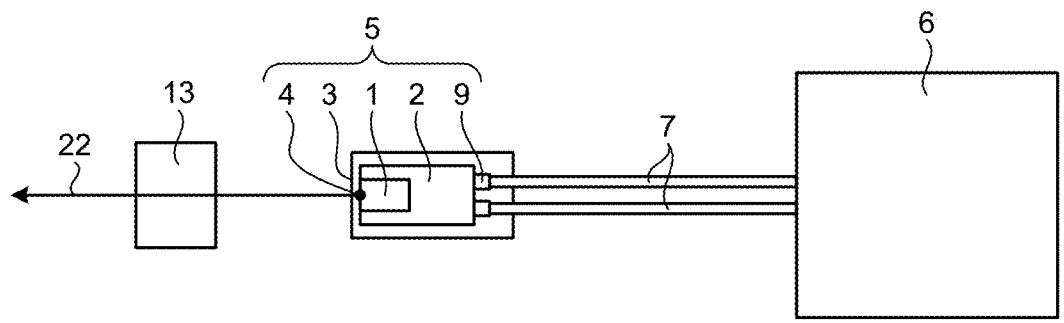
FIG. 4 is a diagram illustrating the configuration illustrated in FIG. 3 as viewed in a direction different from that in FIG. 3.

FIG. 3 is a diagram illustrating the main part of a laser device according to the second embodiment of the present invention. FIG. 4 is a diagram illustrating the configuration illustrated in FIG. 3 as viewed in a direction different from that in FIG. 3. In the second embodiment, a height H2 from the installation surface 21 of the base material 10, on which the adjustment component 3 is installed, to the pipe 7 is lower than a height H1 from the installation surface 21 to an optical axis 22 of a laser beam. In the second embodiment, components identical to those in the first embodiment are denoted by the same reference signs, and configuration differences from the first embodiment will be mainly described. FIG. 3 depicts components arranged in the housing of the laser device 101 as viewed from the side. In FIG. 3, the base material 10 is represented by broken lines.

The laser device 101 includes a covering material 20 that covers the upper part of the pipe 7. The covering material 20 is a metal plate material. The covering material 20 is provided at a position higher than the height H2 from the installation surface 21 to the pipe 7 and lower than the height H1 from the installation surface 21 to the optical axis 22. The covering material 20 covers the upper part of the plurality of pipes 7 connected to the respective LD packages 5 and the manifold 6. Note that FIG. 4 depicts the configuration illustrated in FIG. 3 without the covering material 20 as viewed from above. The LD package 5 illustrated in FIG. 4 is one of the plurality of LD packages 5 connected to the manifold 6.

The laser device 101 includes the pipe 7 at the height H2 lower than the height H1 of the optical axis 22, whereby the pipe 7 can be suppressed from being irradiated with the laser beam and being irradiated with scattered light. The scattered light is scattered light generated by the incidence of the laser beam on each optical element provided in the optical path of the laser beam, or scattered light generated by the incidence of the laser beam from each optical element on a structure such as a housing. The laser device 101 can suppress the deterioration of the pipe 7 by making it possible to prevent the pipe 7 from being irradiated with the laser beam and being irradiated with scattered light. The laser device 101 can suppress the deterioration of the pipe 7 even in the case where a resin material having inferior light resistance is used for the pipe 7.

Further, because the laser device 101 includes the covering material 20, a shield from the laser beam and scattered light can be provided by the covering material 20. Thus, the laser device 101 can further suppress the deterioration of the pipe 7.

Figure 5:
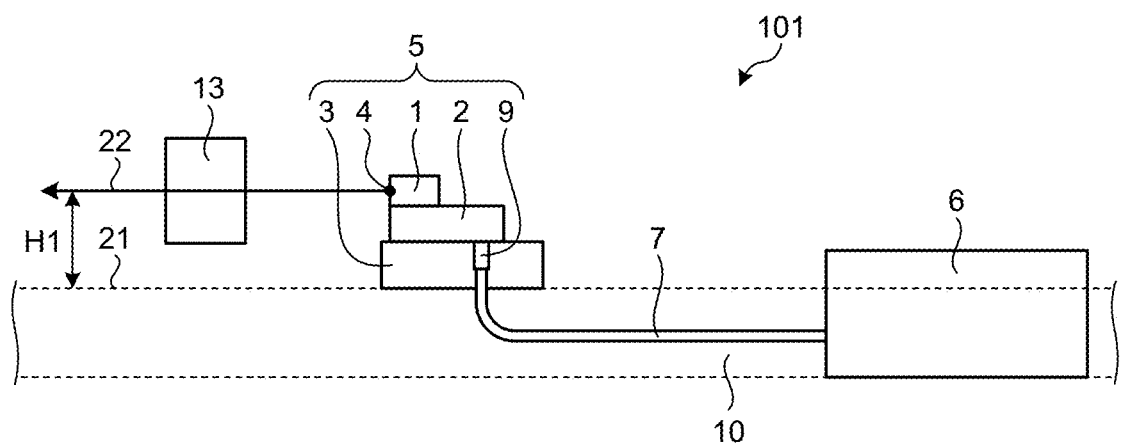
FIG. 5 is a diagram illustrating the main part of a laser device according to a modification of the second embodiment.

FIG. 5 is a diagram illustrating the main part of a laser device according to a modification of the second embodiment. In the laser device 101 according to this modification, the pipe 7 is provided at a position opposite the adjustment component 3 with respect to the installation surface 21. In FIG. 5, the pipe 7 is embedded in the base material 10. A portion of the manifold 6 including the connection to the pipe 7 is embedded in the base material 10 together with the pipe 7. The connection portion 9 is embedded in the adjustment component 3. The connection portion 9 is directed from the heat sink 2 toward the installation surface 21.

The pipe 7 passes through the adjustment component 3 and the base material 10. The pipe 7 provided between the heat sink 2 and the manifold 6 is covered with the adjustment component 3 and the base material 10 as a whole. Thus, the pipe 7 is isolated from the space through which the laser beam passes. Further, each of the plurality of pipes 7 is isolated from the space through which the laser beam passes, in the same manner as the pipe 7 illustrated in FIG. 5.

The modification of the second embodiment also enables the laser device 101 to suppress the pipe 7 from being irradiated with the laser beam and being irradiated with scattered light. Thus, the laser device 101 can suppress the deterioration of the pipe 7.

Third Embodiment

Figure 6:
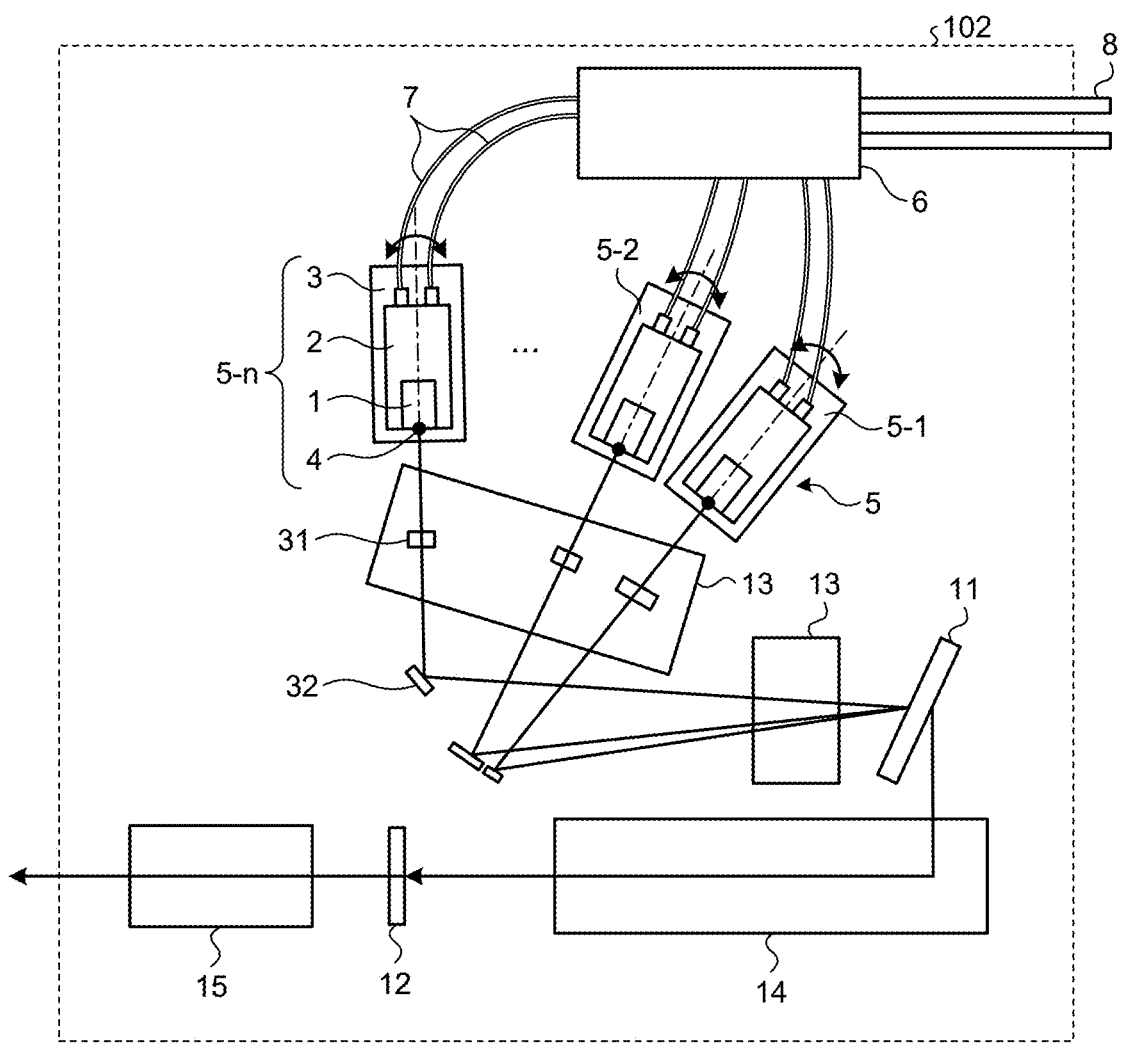
FIG. 6 is a diagram illustrating a configuration of a laser device according to a third embodiment of the present invention.

FIG. 6 is a diagram illustrating a configuration of a laser device according to the third embodiment of the present invention. In the laser device 102 according to the third embodiment, it is possible to not only adjust the orientation of the LDs 1 with the adjustment component 3 but also adjust the orientation of at least one of the optical elements arranged in the optical paths of laser beams. In the third embodiment, components identical to those in the first and second embodiments are denoted by the same reference signs, and configuration differences from the first and second embodiments will be mainly described.

Here, for the adjustment component 3 and each of optical elements 31 and 32, the axis perpendicular to the installation surface 21 is defined as the first axis, and the axis parallel to the installation surface 21 and perpendicular to the optical axis is defined as the second axis. The transmission optical system 13 includes n pieces of optical elements 31 and n pieces of optical elements 32. The optical elements 31 are prisms that transmit laser beams. The optical elements 32 are mirrors that reflect laser beams.

The adjustment component 3 is rotatable around the adjustment shaft 16, which is the first axis. Each of the optical elements 31 is supported to be rotatable around the second axis when the direction of the optical axis is adjusted. Each of the optical elements 32 is supported to be rotatable around the first axis and rotatable around the second axis when the direction of the optical axis is adjusted. Here, the configuration for supporting each of the optical elements 31 and 32 is neither illustrated nor described.

For each laser beam traveling between each LD 1 and the wavelength dispersion element 11, the orientation of the optical axis in the plane parallel to the installation surface 21 is adjusted by the rotation of the adjustment component 3 around the adjustment shaft 16 and the rotation of the optical element 32 around the first axis. In addition, for each laser beam traveling between each LD 1 and the wavelength dispersion element 11, the orientation of the optical axis in the plane perpendicular to the installation surface 21 and parallel to the optical axis is adjusted by the rotation of the optical element 31 around the second axis and the rotation of the optical element 32 around the second axis. Thus, in the laser device 102, for each laser beam traveling between each LD 1 and the wavelength dispersion element 11, the orientation of the optical axis in the plane parallel to the installation surface 21 and the orientation of the optical axis in the plane perpendicular to the installation surface 21 and parallel to the optical axis are adjusted. Each of the optical elements 31 and 32 is fixed, with a state the orientation of the optical axis adjusted.

By combining the rotation of the adjustment component 3 and the rotation of the optical elements 31 and 32 in the laser device 102, it is possible to adjust the orientation of the optical axis in the plane parallel to the installation surface 21 and the orientation of the optical axis in the plane perpendicular to the installation surface 21 and parallel to the optical axis. In the transmission optical system 13, the optical elements that are rotatable when the orientation of the optical axis is adjusted are not limited to the optical elements 31 and 32 described in the third embodiment. In the laser device 102, any of the optical elements included in the transmission optical system 13 may be rotatable.

In the laser device 102, it is possible to accurately adjust the orientation of the optical axis of each laser beam traveling between each LD 1 and the wavelength dispersion element 11. The accurate adjustment of the orientation of the optical axis enables the laser device 102 to emit a laser beam of high beam quality. Because the emission end 4 can be positioned with the adjustment shaft 16, the laser device 102 can reduce the amount of change, associated with the adjustment of the orientation of each LD 1, in the traveling direction of the laser beam emitted from the LD 1. The size of each of the optical elements 31 and 32 required for the optical elements 31 and 32 to receive a laser beam can be reduced. This makes it possible to reduce the size of the laser device 102 and reduce the cost of the laser device 102.

According to the third embodiment, the rotation of the adjustment component 3 and the rotation of the optical elements 31 and 32 enable the orientation of the optical axis to be easily and accurately adjusted in the laser device 102. Thus, the laser device 102 can achieve the effect that the traveling direction of each laser beam that is emitted from the plurality of LDs 1 can be easily adjusted.

Fourth Embodiment

Figure 7:
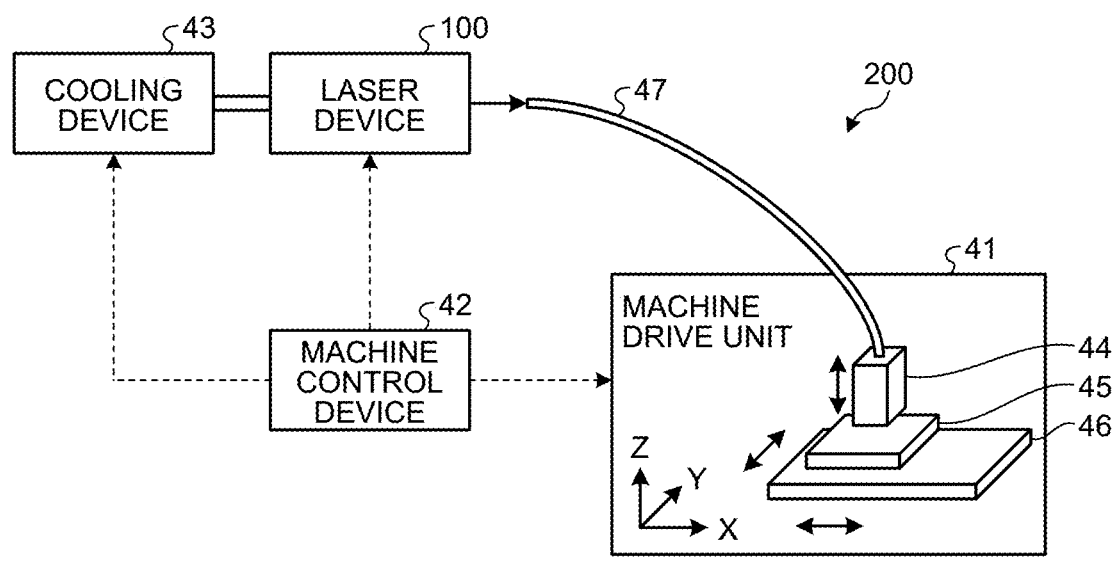
FIG. 7 is a diagram illustrating a configuration of a laser processing machine according to a fourth embodiment of the present invention.

FIG. 7 is a diagram illustrating a configuration of a laser processing machine according to the fourth embodiment of the present invention. The laser processing machine 200 according to the fourth embodiment includes the laser device 100 according to the first embodiment. The laser processing machine 200 processes a workpiece 45 by irradiating the workpiece 45 with the laser beam emitted from the laser device 100. In the fourth embodiment, components identical to those in the first to third embodiments are denoted by the same reference signs, and configuration differences from the first to third embodiments will be mainly described.

The laser processing machine 200 includes a machine drive unit 41, a machine control device 42, and a cooling device 43. The machine drive unit 41 is a unit that machines the workpiece 45. The machine control device 42 controls the entire laser processing machine 200. The cooling device 43 cools the cooling water that is supplied to the laser device 100. The machine drive unit 41 includes a processing head 44 that emits a laser beam and a table 46 on which the workpiece 45 is placed. The machine drive unit 41 also includes an axis drive unit that moves the processing head 44 in the Z-axis direction, which is the vertical direction, and an axis drive unit that moves the table 46 in the X-axis direction and the Y-axis direction in the horizontal plane. Thus, the machine drive unit 41 causes the processing head 44 and the workpiece 45 to make relative movements in the X-axis direction, the Y-axis direction, and the Z-axis direction. In FIG. 7, the axis drive units are not illustrated.

A process fiber 47 is a transmission line for sending the laser beam emitted from the laser device 100 to the processing head 44. The machine control device 42 controls the laser device 100, the machine drive unit 41, and the cooling device 43.

The laser processing machine 200 uses the process fiber 47 conformable to the beam quality of the laser beam that is emitted from the laser device 100. By having the laser device 100, the laser processing machine 200 enables a laser beam of high beam quality to be incident on the process fiber 47. The laser processing machine 200 can efficiently propagate the laser beam from the laser device 100 to the processing head 44.

The laser processing machine 200 may include the laser device 101 according to the second embodiment or the laser device 102 according to the third embodiment, instead of the laser device 100. The laser processing machine 200 including the laser device 101 or 102 can also efficiently propagate the laser beam to the processing head 44. According to the fourth embodiment, the laser processing machine 200 includes any one of the laser devices 100, 101, and 102, and thus can achieve the effect that efficient processing can be performed by radiating a laser beam of high beam quality.

The configurations described in the above-mentioned embodiments indicate examples of the contents of the present invention. The configurations can be combined with another well-known technique, and some of the configurations can be omitted or changed in a range not departing from the gist of the present invention.

REFERENCE SIGNS LIST

1 laser diode (LD); 2 heat sink; 3 adjustment component; 4 emission end; 5, 5-1, 5-2, 5-n LD package; 6 manifold; 7, 8 pipe; 9 connection portion; 10 base material; 11 wavelength dispersion element; 12 partial reflection mirror; 13, 14, 15 transmission optical system; 16 adjustment shaft; 20 covering material; 21 installation surface; 22 optical axis; 31, 32 optical element; 41 machine drive unit; 42 machine control device; 43 cooling device; 44 processing head; 45 workpiece; 46 table; 47 process fiber; 100, 101, 102 laser device; 200 laser processing machine.

The invention claimed is:

1. A laser device comprising:
   a plurality of laser diodes configured to emit laser beams having different wavelengths;
   a mirror configured to resonate the plurality of laser beams emitted by the plurality of laser diodes; and
   a wavelength dispersion element configured to cause the plurality of laser beams incident from the plurality of laser diodes in different orientations of optical axes of the laser beams to travel to the mirror with the optical axes aligned, wherein
   each of the plurality of laser diodes is integrally formed with an adjustment component that is rotatable around an emission end of the laser diode;
   each of the plurality of laser diodes is integrated with a heat sink that is configured to cool the laser diode;
   the heat sink is connected to a pipe for inflow of a refrigerant to the heat sink and outflow of the refrigerant from the heat sink; and
   a height from an installation surface on which the adjustment component is installed to the pipe is lower than a height from the installation surface to the optical axis of the laser beam.

2. The laser device according to claim 1, comprising
   an adjustment shaft located directly below the emission end and serving as a center of rotation of the adjustment component, wherein
   the adjustment shaft is embedded in a base material on which the adjustment component is installed and in the adjustment component.

3. The laser device according to claim 2, wherein
   each of the plurality of laser diodes is integrated with a heat sink, the heat sink being configured to cool the laser diode,
   the heat sink is connected to the pipe for inflow of the refrigerant, to the heat sink and outflow of the refrigerant from the heat sink, and
   the pipe is a flexible resin hose.

4. The laser device according to claim 3, comprising
   a covering material configured to cover the pipe, wherein
   the covering material is provided at a position higher than the height from the installation surface to the pipe and lower than the height from the installation surface to the optical axis of the laser beam.

5. A laser processing machine comprising
   the laser device according to claim 4, wherein
   the laser processing machine is configured to process a workpiece by irradiating the workpiece with a laser beam emitted from the laser device.

6. The laser device according to claim 3, wherein the pipe is provided at a position opposite the adjustment component with respect to the installation surface on which the adjustment component is installed.

7. A laser processing machine comprising
   the laser device according to claim 6, wherein
   the laser processing machine is configured to process a workpiece by irradiating the workpiece with a laser beam emitted from the laser device.

8. A laser processing machine comprising
   the laser device according to claim 3, wherein
   the laser processing machine is configured to process a workpiece by irradiating the workpiece with a laser beam emitted from the laser device.

9. A laser processing machine comprising
   the laser device according to claim 2, wherein
   the laser processing machine is configured to process a workpiece by irradiating the workpiece with a laser beam emitted from the laser device.

10. The laser device according to claim 1, wherein the pipe is a flexible resin hose.

11. A laser processing machine comprising
    the laser device according to claim 3, wherein
    the laser processing machine is configured to process a workpiece by irradiating the workpiece with a laser beam emitted from the laser device.

12. The laser device according to claim 10, wherein the pipe is provided at a position opposite the adjustment component with respect to the installation surface on which the adjustment component is installed.

13. A laser processing machine comprising
    the laser device according to claim 12, wherein
    the laser processing machine is configured to process a workpiece by irradiating the workpiece with a laser beam emitted from the laser device.

14. The laser device according to claim 1, comprising
    a covering material to cover the pipe, wherein
    the covering material is provided at a position higher than the height from the installation surface to the pipe and lower than the height from the installation surface to the optical axis of the laser beam.

15. A laser processing machine comprising
    the laser device according to claim 14, wherein
    the laser processing machine is configured to process a workpiece by irradiating the workpiece with a laser beam emitted from the laser device.

16. A laser processing machine comprising
    the laser device according to claim 1, wherein
    the laser processing machine is configured to process a workpiece by irradiating the workpiece with a laser beam emitted from the laser device.

17. A laser device comprising:
    a plurality of laser diodes to emit laser beams having different wavelengths;
    a mirror to resonate the plurality of laser beams emitted by the plurality of laser diodes; and
    a diffraction grating to cause the plurality of laser beams incident from the plurality of laser diodes in different orientations of optical axes of the laser beams to travel to the mirror with the optical axes aligned, wherein each of the plurality of laser diodes is integrally formed with an adjustment component that is rotatable around an emission end of the laser diode, and
a height from an installation surface on which the adjustment component is installed to a pipe carrying refrigerant to the laser diode is lower than a height from the installation surface to the optical axis of the laser beam.

* * * * *